United States Patent

Kanamaru et al.

[15] 3,693,094

[45] Sept. 19, 1972

[54] APPARATUS FOR SUPERIMPOSING AN AFC VOLTAGE ON UHF AND VHF TUNING VOLTAGES FOR CHANNEL SELECTION

[72] Inventors: Toshiji Kanamaru; Katsumi Morita, both of Kadoma; Akio Okada, Osaka, all of Japan

[73] Assignee: Matsushita Electric Industrial Co., Ltd., Osaka, Japan

[22] Filed: June 22, 1970

[21] Appl. No.: 48,407

[30] Foreign Application Priority Data

June 25, 1969 Japan ......................44/51424
June 27, 1969 Japan ......................44/51992

[52] U.S. Cl. ..........325/461, 178/7.3 R, 178/7.3 DC, 178/5.8 F, 325/457, 325/422, 325/423, 334/16

[51] Int. Cl. ..............................................H04b 1/16

[58] Field of Search ...........178/7.3 R, 7.3 DC, 5.8 F; 334/14–16; 325/404, 405, 409, 457, 461, 458, 459

[56] References Cited

UNITED STATES PATENTS

| | | | |
|---|---|---|---|
| 3,497,620 | 2/1970 | Kent et al | 178/7.3 R |
| 3,241,072 | 3/1966 | Brand | 325/461 |
| 3,328,700 | 6/1967 | Chipman | 325/457 |

*Primary Examiner*—Albert J. Mayer
*Attorney*—Stevens, Davis, Miller & Mosher

[57] ABSTRACT

In impressing both a tuning voltage and an AFC voltage in superimposition upon each other on the UHF and VHF tuners in a television set, a voltage produced by superimposing a pre-regulated tuning voltage and an AFC voltage upon each other is impressed on the UHF tuner and a voltage produced by regulating a voltage obtained by superimposing a constant DC voltage and the AFC voltage upon each other is impressed on the VHF tuner, thus ensuring reliable selection of channels in either UHF or VHF band.

5 Claims, 6 Drawing Figures

T. KANAMARU,
K. MORITA AND
A. OKADA
INVENTORS

BY Stevens, Davis, Miller & Mosher
ATTORNEYS

APPARATUS FOR SUPERIMPOSING AN AFC VOLTAGE ON UHF AND VHF TUNING VOLTAGES FOR CHANNEL SELECTION

This invention relates to tuning systems for television sets, and more particularly to a channel selection system including a UHF tuner and a VHF tuner.

An object of the invention is to provide for rendering a voltage produced by superimposing both a tuning voltage and the AFC voltage upon each other suitable for impression on either the UHF or VHF tuner. In such a case that the tuning voltage and the AFC voltage are impressed on a variable capacity diode used as a condenser comprising the tuning circuit and the resonance circuit of a tuner, the following two methods are considered. That is, one of them is to impress a selection voltage on one end of the variable capacity diode and the AFC voltage on the other end of the variable capacity diode, and the other is to impress a voltage produced by superimposing both the tuning voltage and the AFC voltage upon one end of the variable capacity diode.

The former method has a defect that a lot of terminals of the tuner are necessary, since there must be provided connecting terminals at both ends of the variable capacity diode.

Thus, ordinarily a system of obtaining a voltage produced by superimposing both the tuning voltage and the AFC voltage, is used.

On the contrary, in a television receiver provising a VHF tuner and a UHF tuner it is absolutely necessary to take the AFC into consideration in order to obtain good sensitivity. That is, the relation of a selecting voltage to a channel in a VHF tuner is curved as shown in FIG. 3, and the relation of a selecting voltage to a channel in a UHF tuner is linear as shown in FIG. 4.

Accordingly, it should be described how the AFC voltage is superimposed in case of the VHF tuner the the UHF tuner.

The subject matter of this invention is directed to the superimposition of the AFC voltage.

The invention will now be described in conjunction with preferred embodiments thereof with reference to the accompanying drawings, in which.

Figure 1:
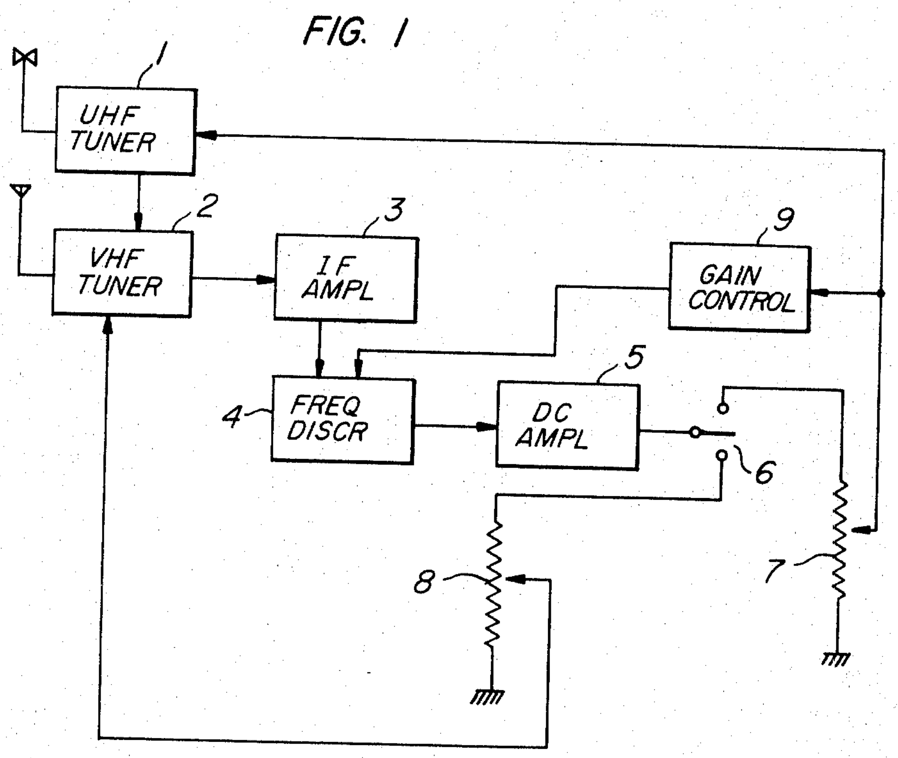
FIG. 1 is a block diagram, partly in schematic form, showing an embodiment of the channel selection system according to the invention.

Referring now to Fig. 1, there is shown a preferred embodiment of the channel selection system comprising a UHF tuner 1, a VHF tuner 2, an intermediate frequency amplifier 3, a frequency discriminator 4, a DC amplifier 5, a switch 6, a variable resistor 7 for providing UHF tuning voltage, a variable resistor 8 giving a VHF tuning voltage, and an automatic gain control 9 to control the gain of a carrier amplifier built in the frequency discriminator 4.

Figure 2:
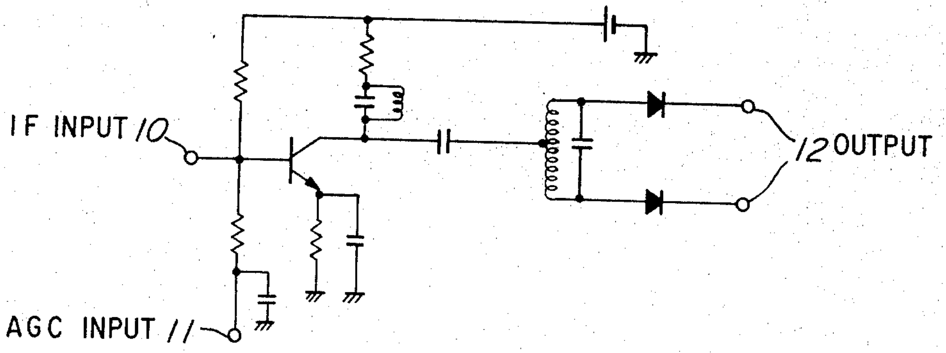
FIG. 2 is a circuit diagram showing part of the system of FIG. 1 in detail.

The frequency discriminator 4 in the above system is shown in detail in Fig. 2. In the figure, numeral 10 designates a carrier input terminal connected to the intermediate frequency amplifier 3, numeral 11 designates an AGC terminal connected to the automatic gain control 9, and numeral 12 designates an output terminal connected to the DC amplifier 5. The DC amplifier 5 serves to shift the output of the discriminator 4 to a level of 30 volts, for instance.

Figure 3:
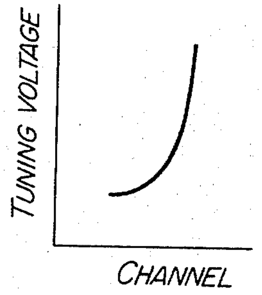
FIGS. 3 and 4 are graphs showing the tuning characteristics of the system of Fig. 1.

In operation, when the switch 6 is thrown to the side of the variable resistor 8, the output is impressed through the variable resistor 8 on a channel determining terminal of the VHF tuner 2. The channel selection is attained by adjusting the variable resistor 8. The output of the DC amplifier 5 has a component accounting for the output from the frequency discriminator 4 superimposed on a DC voltage, so that by reducing the resistance offered by the variable resistor 8 to reduce the DC component the amplitude of the AFC voltage may be reduced. For the VHF band, there is a relationship between the channel (frequency) and the tuning voltage, as shown in FIG. 3, and for the same drawing frequency range the AFC voltage may be lower as the tuning voltage is lower and the former may be higher as the latter is higher. Thus, the voltage output of the DC amplifier 5 may be properly regulated by appropriately adjusting the variable resistor 8.

When the switch 6 is thrown to the side of the variable resistor 7, the signal on the variable terminal of the variable resistor 7 is impressed on both the UHF tuner 1 and the AGC circuit 9 to vary the output of the frequency discriminator 4. Thus, the selection of channels in the UHF band may be attained by appropriately adjusting the variable resistor 7.

Figure 4:
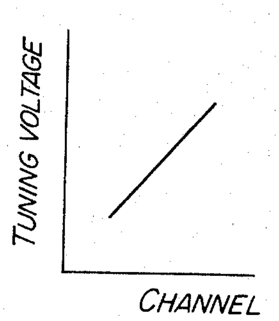

For the UHF band the relation between the channel (frequency) and the tuning voltage is linear, as shown in Fig. 4, so that a constant AFC voltage is required for impression on the UHF tuner 1. Accordingly, the AFC output voltage on the variable terminal of the variable resistor 7 is made constant through the action of the AGC circuit 9 to increase the output of the frequency discriminator 4 when the tuning voltage is reduced by reducing the resistance offered by the variable resistor 7.

As is described, with the channel selecting system according to the invention it is possible to provide a voltage suitable for impression on the UHF tuner by superimposing a DC voltage on the output of the frequency discriminator and regulating the resultant output voltage by the variable resistor to produce the voltage that is impressed on a channel selecting terminal of the UHF tuner while being fed back to the frequency discriminator through the AGC circuit, as well as providing a voltage suitable for impression on the VHF tuner.

Figure 6:
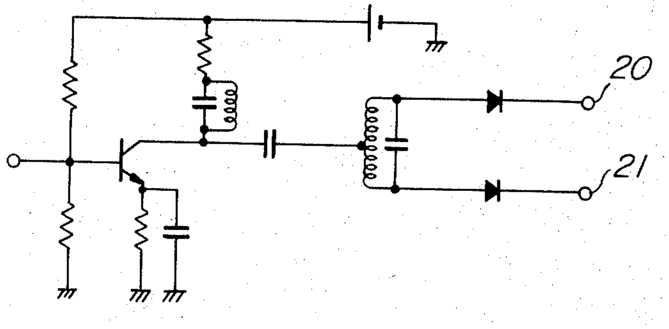
FIG. 6 is a circuit diagram showing part of the system of FIG. 5 in detail.
Figure 5:
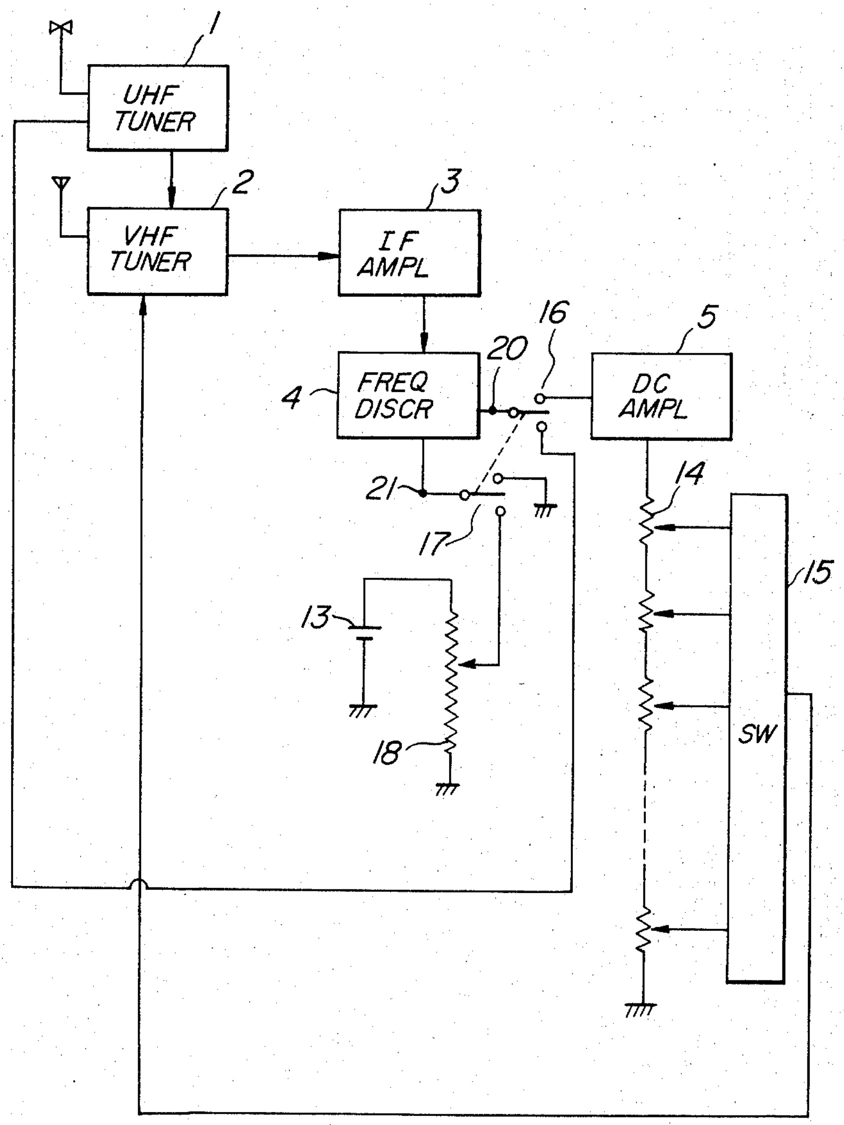
FIG. 5 is a block diagram, partly in schematic form, showing another embodiment of the channel selection system according to the invention.

Another embodiment of the channel selection system is shown in FIG. 5. In this embodiment, parts 1 to 5 are the same as the corresponding parts in the previous embodiment of FIG. 1. The frequency discriminator 4 in the second embodiment is shown in detail in FIG. 6. It has a terminal 20 connected to a switch 16 and a terminal 21 connected to a switch 17. Referring To FIG. 5, the switch 16 is inserted between the frequency discriminator 4 and either the DC amplifier or the UHF tuner 1, and the switch 17 is inserted Between the frequency discriminator 4 and either the variable resistor 18 or the earth. The variable resistor 18 is connected to a power supply 13. Series variable resistors 14 are provided to divide the voltage output of the DC amplifier 5. A multi-position switch 15 is inserted between the variable resistors 14 on one hand and the VHF tuner 2 on the other hand for selectively delivering a plurality of voltages on the respective variable resistors 14 to the VHF tuner 2.

In operation, when the switches 16 and 17, which are ganged together, are thrown to the upper position, the terminal 21 of the discriminator 4 is grounded and the sinusoidal output on the terminal 20 is fed through the switch 16 to the DC amplifier 5 for superimposition on a DC voltage (for instance, of 30 volts). The output of the DC amplifier 5 is added to the variable load 14, and a given tuning voltage is selected for impression on the VHF tuner 2. As the relation between the tuning voltage and the channel (frequency) for the VHF tuner 2 is of a character as shown in FIG. 3, it has no appreciable undesired effects on this system if the output AFC voltage (the amplitude of the sinusoidal voltage) decreases in proportion to the decreasing DC voltage, because of the fact that in the region of lower tuning voltages a slight change in voltage corresponds to a very large change in frequency, while in the region of higher tuning voltages a very large change of voltage is required for a slight change in frequency, as is apparent from FIG. 3. Thus, the same AFC action can be achieved without altering the mode of operation.

When the switches 16 and 17 are thrown to the lower position, a suitable voltage obtained by appropriately adjusting the variable resistor 18 is added to the frequency discriminator 4 for superimposition upon the AFC voltage, and the resultant output is impressed through the switch 16 on the UHF tuner 1. As the relation between the tuning voltage and the channel (frequency) for the UHF tuner 1 is linear as shown in FIG. 4, if the output of the frequency discriminator 4 is superimposed on the tuning voltage in the same manner as for the VHF tuner taking out a given voltage via the variable load, with a low tuning voltage the output of the frequency discriminator 4 is too low to have an AFC action. This is prevented according to this system, as the tuning voltage is adjusted prior to superimposition upon the AFC voltage.

As is described, with this embodiment it is possible to apply an AFC voltage in a mode suitable for both UHF and VHF tuners.

What we claim is:

1. A channel selecting system, comprising:

a VHF tuner having a channel selection voltage impression terminal;

a UHF tuner having a channel selection voltage impression terminal and an output terminal which is connected to said VHF tuner;

an intermediate frequency amplifier connected to the output of said VHF tuner;

a frequency discriminator connected to the output of said intermediate frequency amplifier;

a first variable resistor having a variable terminal which is connected to the VHF channel selection voltage impression terminal and a fixed terminal which is connected to ground;

voltage impression means to impress a constant DC voltage on a third terminal of said first variable resistor;

first switching means connected to one output of said frequency discriminator and having a first terminal connected to said voltage impression means;

means to connect a second terminal of said first switching means to the UHF channel selection voltage impression terminal;

second switching means connected to a second output of said frequency discriminator and having a first terminal connected to ground;

a second variable resistor having a variable tap and having first and second terminals connected across a DC voltage source; and means to connect a second terminal of said second switching means to the variable tap of second variable resistor.

2. A channel selecting system comprising:

a VHF tuner having a channel selection voltage impression terminal;

a UHF tuner having a channel selection voltage impression terminal and an output terminal which is connected to said VHF tuner;

a frequency discriminator connected to the output of said intermediate frequency amplifier;

A first variable resistor having a variable terminal connected to the VHF channel selection voltage impression terminal and a second terminal connected to ground;

a second variable resistor having a variable terminal connected to the UHF channel selection voltage impression terminal and a second terminal connected to ground;

superimposing means connected to the output of said frequency discriminator to superimpose a constant DC voltage on the output of said frequency discriminator;

switching means to selectively switch the output of said superimposing means between third terminals of each of said first and second variable resistors; and gain control means connected between said second variable resistor and said frequency discriminator to control feedback of the output of the variable terminal of said second variable resistor to said frequency discriminator independently of the movement of the variable terminal of said second variable resistor so that a constant output of said frequency discriminator appears at the variable terminal of said second variable resistor.

3. A channel selecting system comprising:

a VHF tuner having a channel selection voltage impression terminal;

a UHF tuner having a channel selection voltage impression terminal and an output terminal which is connected to said VHF tuner;

an intermediate frequency amplifier connected to the output of said VHF tuner;

a frequency discriminator connected to the output of said intermediate frequency amplifier;

a first variable resistor having a variable terminal which is connected to the VHF channel selection voltage impression terminal and a first fixed terminal which is connected to ground;

means connected between a second fixed terminal of said first variable resistor and the output of said frequency discriminator for superimposing a constant DC voltage on the output of said frequency discriminator;

a second variable resistor connected between the UHF channel selection voltage impression terminal and ground;

means to impress the output of said frequency discriminator on said second variable resistor;

switching means for selectively applying the output of said frequency discriminator, having said constant DC voltage superimposed thereon, onto said second fixed terminal of said first variable resistor; and means for substantially impressing the output of said frequency discriminator having said constant DC voltage superimposed thereon onto said UHF channel selection voltage impression terminal when said switching means is switched out of engagement with said second fixed terminal of said first variable resistor, wherein said output of said frequency discriminator having said constant DC voltage superimposed thereon comprises a regulated voltage obtained from the variable terminal of said second variable resistor and the output voltage of said frequency discriminator.

4. A channel selecting system comprising:

a VHF tuner having a channel selection voltage impression terminal;

a UHF tuner having a channel selection voltage impression terminal and an output terminal which is connected to said VHF tuner;

an intermediate frequency amplifier connected to the output of said VHF tuner;

a frequency discriminator connected to the output of said intermediate frequency amplifier;

first variable resistance means having a variable terminal which is connected to the VHF channel selection voltage impression terminal;

second variable resistance means connected to the UHF channel selection voltage impression terminal;

superimposing means connected to said frequency discriminator for superimposing a DC voltage level on the output of said frequency discriminator;

VHF selection means for applying the superimposed output of said frequency discriminator to the VHF channel selection voltage impression terminal through said first variable resistance means;

UHF selection means for applying the superimposed output of said frequency discriminator to the UHF channel selection voltage impression terminal through said second variable resistance means; and means for selectively switching the superimposed output of said frequency discriminator between said VHF selection means and said UHF selection means.

5. A channel selecting system comprising:

a VHF tuner having a channel selection voltage impression terminal;

a UHF tuner having a channel selection voltage impression terminal and an output terminal which is connected to said VHF tuner;

an intermediate frequency amplifier connected to the output of said VHF tuner;

a frequency discriminator having a first input connected to the output of said intermediate frequency amplifier, and a second input; and UHF–VHF coupling means having an input coupled to the output of said frequency discriminator and first, second and third outputs, said first output being coupled to the second input of said frequency discriminator for applying a gain control signal thereto; said second output being coupled to said UHF channel selection voltage impression terminal for applying to said UHF terminal a voltage corresponding to the output of said frequency discriminator; and said third output being coupled to the VHF channel selection voltage impression terminal for applying to said VHF terminal a voltage corresponding to the output of said frequency discriminator having a DC component superimposed thereon.

* * * * *